United States Patent [19]
Mizushima

[11] Patent Number: 5,828,104
[45] Date of Patent: Oct. 27, 1998

[54] MOS STRUCTURE DEVICE HAVING ASYMMETRIC LDD STRUCTURE AND FABRICATION METHOD THEREOF

[75] Inventor: Kazuyuki Mizushima, Tokyo, Japan

[73] Assignee: NEC Corporation, Tokyo, Japan

[21] Appl. No.: 962,807

[22] Filed: Nov. 3, 1997

Related U.S. Application Data

[63] Continuation of Ser. No. 521,849, Aug. 31, 1995, abandoned.

[30] Foreign Application Priority Data

Sep. 1, 1994 [JP] Japan .................................. 6-232283

[51] Int. Cl.$^6$ ............................. H01L 29/76; H01L 29/94
[52] U.S. Cl. ........................ 257/344; 257/327; 257/336; 257/388; 257/408; 257/412; 257/413; 257/900; 438/286; 438/305
[58] Field of Search .................................... 257/327, 336, 257/344, 388, 408, 412, 413, 900; 437/41, 44; 438/286, 305

[56] References Cited

U.S. PATENT DOCUMENTS

| | | | |
|---|---|---|---|
| 4,419,809 | 12/1983 | Riseman et al. | 257/344 |
| 4,981,810 | 1/1991 | Fazan et al. | 257/900 |
| 5,014,097 | 5/1991 | Kazerounian et al. | 257/344 |
| 5,164,806 | 11/1992 | Nagatomo et al. | 257/900 |
| 5,477,070 | 12/1995 | Nam | 257/408 |
| 5,547,885 | 8/1996 | Ogoh | 437/44 |

FOREIGN PATENT DOCUMENTS

| | | |
|---|---|---|
| 62-58682 | 3/1987 | Japan . |
| 63-142676 | 6/1988 | Japan . |
| 2158143 | 6/1990 | Japan . |
| 4245642 | 9/1992 | Japan . |

Primary Examiner—Valencia Martin Wallace
Attorney, Agent, or Firm—Sughrue, Mion, Zinn, Macpeak & Seas, PLLC

[57] ABSTRACT

An MOS semiconductor device containing an MOSFET with an asymmetric LDD structure, which has in a semiconductor substrate a first heavily doped region, a lightly doped region formed adjacent to the first heavily doped region, and a second heavily doped region formed apart from the first lightly doped region. The first heavily doped region and the lightly doped region act as a drain region of the MOSFET, and the second heavily doped region acts as a source region thereof. A gate electrode composed of a plurality of parts is positioned over a channel region. At least one of the parts has a drain-side end positioned over the lightly doped region and a source-side end positioned over the channel region not to extend to the second heavily doped region. Free design can be realized without layout restriction and fabricated with high reproducibility in large quantities.

11 Claims, 8 Drawing Sheets

MOS STRUCTURE DEVICE HAVING ASYMMETRIC LDD STRUCTURE AND FABRICATION METHOD THEREOF

This is a Continuation of application Ser. No. 08/521,849 filed Aug. 31, 1995 now abandoned.

BACKGROUND OF THE INVENTION

1. Field of the Invention

The present invention relates to a Metal-Oxide-Semiconductor (MOS) semiconductor device and more particularly, to an MOS semiconductor device having an asymmetric Lightly Doped Drain (LDD) structure and a fabrication method of the device, in which the device can be designed without layout restriction and be fabricated with high reproducibility in large quantities.

2. Description of the Prior Art

The operation speed of the MOS Field-Effect Transistor (MOSFET) has been enhanced by reduction of the gate oxide thickness and the gate length, in other words, by scale reduction of the dimension of the MOSFET itself according to the scaling law. However, when the gate length becomes 1 $\mu$m or less, the short-channel effect tends to occur remarkably. The short-channel effect causes the threshold voltage of the MOSFET to fluctuate due to the drain voltage.

To avoid the short-channel effect, it is necessary to increase the doping concentration of the channel region so that the depletion layer is restricted to expand from the drain region. However, the electric field concentration increases in the vicinity of the drain region as the doping concentration of the channel region increases because the supply voltage cannot be lowered according to the scaling law. These high electric-field concentration generate hot carriers which degrade the operational characteristics or performance of the MOSFET.

To cope with the problem, a symmetric LDD structure was developed and has been employed practically. FIG. 1 shows a conventional MOSFET with the symmetric LDD structure.

In FIG. 1, a pair of lightly doped regions 34a and 34b and a pair of heavily doped regions 35a and 35b are formed in a surface area of a silicon substrate 31. The surface area of the substrate 31 is covered with a gate oxide film 32. A gate electrode 33 and a pair of sidewall spacers 36a and 36b are formed on the gate oxide film 32 on each side of the electrode 33. The gate electrode 33 is typically made of either a patterned polysilicon film heavily doped with an impurity or a combination of a polysilicon film and a refractory metal silicide film stacked on the polysilicon film. The pair of heavily doped regions 35a and 35b are formed symmetrically with respect to the gate electrode 33. The pair of lightly doped regions 34a and 34b also are formed symmetrically with respect to the gate electrode 33. The heavily doped region 35a and the lightly doped region 34a constitute a drain region of the MOSFET. The heavily doped region 35b and the lightly doped region 34b constitute a source region of the MOSFET.

The conventional MOSFET of FIG. 1 is fabricated by the following process sequence: The gate oxide film 32 is formed on the surface of the substrate 31 by a thermal oxidation process. Then, the gate electrode 33 is formed on the film 32 Using the gate electrode 33 as a mask, an impurity is selectively ion-implanted into the substrate 31 to produce the pair of lightly doped regions 34a and 34b. An oxide film is formed to cover the entire substrate 31 by a Chemical Vapor Deposition (CVD) process and then, the oxide film is patterned by an anisotropic etching process, producing the pair of sidewall spacers 36a and 36b on the film 32. Subsequently, using the gate electrode 33 and the pair of sidewall spacers 36a and 36b as a mask, another impurity is selectively ion-implanted into the substrate 31 to produce the pair of heavily doped regions 35a and 35b.

With the conventional MOSFET of FIG. 1, the source resistance increases and the current driving ability degrades because the lightly doped region 34b is formed on the source side.

To solve this problem, an asymmetric LDD structure was developed in which either no lightly doped region is provided on the source side or a lightly doped region on the source side is formed to be extremely short, resulting in a reduced parasitic resistance on the source side only.

FIGS. 2A to 2C show a typical fabrication sequence of an MOSFET with the asymmetric LDD structure, respectively.

First, as shown in FIG. 2A, a gate oxide film 22 is formed on a surface of a p-silicon substrate 21 by a thermal oxidation process. Then, a gate electrode 23 is formed on the film 22. Using the gate electrode 23 as a mask, an n-impurity is selectively ion-implanted into the substrate 21 to produce a pair of lightly doped regions 24a and 24b.

Next, as shown in FIG. 2B, a patterned photoresist film 27 is formed to cover the entire substrate 21 by a photolithography process. The film 27 has an end placed over the gate electrode 23, covers an area where a lightly doped region is to be formed, and exposes the region 24b. Using the photoresist film 27 as a mask, an n-impurity is selectively ion-implanted into the substrate 21 to produce a heavily doped region 25b on the source side.

After removing the photoresist film 27, an oxide film is deposited over the substrate 21 to be patterned by an anisotropic etching process, producing a pair of sidewall spacers 26a and 26b on the film 22 on each side of the gate electrode 23. Subsequently, using the gate electrode 23 and the pair of sidewall spacers 26a and 26b as a mask, an n-impurity is selectively ion-implanted into the substrate 21a to produce the pair of heavily doped regions 25a and 25b on the drain and source sides, remaining the lightly doped region 24a only on the drain side as shown in FIG. 2C.

With the conventional MOSFET of FIG. 2C, the problem of increase source resistance and degradation of current driving ability can be solved and, at the same time, the intrinsic purpose of the LDD structure can be accomplished since by forming the lightly doped region 24a only on the drain can be prevented. Also, the channel region is heavily doped with the n-impurity so that the depletion layer is restricted to expand from the drain side and therefore, the punch-through phenomenon and the threshold voltage fluctuation can be prevented. Further, because the electric-field concentration is relaxed by the lightly doped region 24a, the performance degradation of the MOSFET due to the hot carriers is prevented.

In addition to the above method of Figs. 2A to 2C, conventionally, various fabrication methods of the MOSFET having the asymmetric LDD structure were developed, some examples of which wore disclosed in the Japanese Non-Examined Patent Publication Nos. 63-142676 (published in 1988), 4-245642 (published in 1992), 62-58682 (published in 1987), and 2-158143 (published in 1990).

In the method of the Japanese Non-Examined Patent Publication No. 63-142676, during the ion-implantation process for forming a pair of lightly doped regions, the implantation orientation of the impurity ions is tilted to one of the source and drain sides. On the other hand, during the ion-implantation process for forming a pair of heavily doped regions, the implantation orientation of the impurity ions is tilted to the other thereof. Thus, the asymmetric LDD structure is realized without sidewall spacers.

In the method of the Japanese Non-Examined Patent Publication No. 4-245642, similar to that of the Publication No. 63-142676, a lightly doped region is formed by is ion-implantation of an impurity only on the drain side, in which the implantation orientation is tilted to the drain side. A pair of heavily doped regions are then formed on the source and drain sides by ion-implantation of an impurity, in which the implantation orientation is perpendicular to the main surface of the substrate. Thus, the asymmetric LDD structure is realized.

In the method of the Japanese Non-Examined Patent Publication No. 62-58682, an insulator film is formed to cover a gate electrode and then, the insulator film is anisotropically etched to produce a pair of sidewall spacers at each side of the gate electrode. During the anisotropic etching process, etching ions are irradiated to the insulator film so that the orientation of the ions is tilted by a specified angle such as 20° to 30° relative to a perpendicular line to the main surface of a semiconductor substrate. Thus, a pair of sidewall spacers is asymmetrically formed by the insulator film on each side of the gate electrode. The sidewall spacer on the source side is thinner than that on the drain side. Using the asymmetrical sidewall spacers, the asymmetric LDD structure is realized by popular ion-implantation processes.

In the method of the Japanese Non-Examined Patent Publication No. 2-158143, a first sidewall spacer having a vertical side face is formed on one side of a gate electrode and a second sidewall spacer having a tapered side face is formed on the other side thereof. Thus, the first and second sidewall spacers are asymmetrically provided. The microloading effect is utilized during the formation process of the sidewall spacers. The second sidewall spacer is provided at a position where another gate electrode is adjacent to the gate electrode concerned. The first sidewall spacer is placed at a position where no other gate electrode is provided adjacent to the gate electrode concerned. Using the asymmetric sidewall spacers, the asymmetric LDD structure is realized by popular ion-implantation processes.

The conventional fabrication methods described above have the following disadvantages:

With the conventional method of FIGS. 2A to 2C, the patterned photoresist film 27 needs to be formed to have the end placed over the gate electrode 23. However, the gate electrode 23 is 200 to 400 $\mu$m in thickness and 0.5 $\mu$m or less in width, which is very minute. Therefore, it is extremely difficult for the photoresist film 27 to be formed on the gate electrode 23 as shown in FIG. 2B with satisfactory accuracy. To solve the difficulty, it is necessary for the photoresist film 27 (a) to place exactly the end of the film 27 on the gate electrode 23 during the photolithography process, (b) to control the thickness reduction of the film 27 during its development process, and (c) to control the angle of a tapered wall or walls of the film 27.

In the methods of the Japanese Non-Examined Patent Publication Nos. 63-142676 and 4-245642, since the implantation orientation of impurity ions is tilted relative to the perpendicular line to the main surface of the substrate, a problem that the source and drain regions are determined dependent upon the tilting side of the implantation orientation, respectively occurs. This problem limits the free layout of the MOSFET.

In the method of the Japanese Non-Examined Patent Publication No. 62-58682 in which the irradiation orientation of the etching ions is tilted relative to the perpendicular line to the main surface of the substrate, the same problem as that of the methods of the Japanese Non-Examined Patent Publication Nos. 63-142676 and 4-245642 occurs.

In the method of the Japanese Non-Examined Patent Publication No. 2-158143 in which the first and second sidewall spacers are asymmetrically formed utilizing the microloading effect, the anisotropic etching process for the spacers requires an extremely severe accuracy. This causes the problem that a dense MOS semiconductor device is difficult to fabricate with excellent reproducibility.

SUMMARY OF THE INVENTION

Accordingly, an object of the present invention is to provide an MOS semiconductor device having an asymmetric LDD structure and a fabrication method thereof in which the device can be designed without the above layout restriction and be fabricated with high reproducibility in large quantities.

An MOS semiconductor device according to a first aspect of the present invention contains an MOSFET with an asymmetric LDD structure. The device has in a semiconductor substrate a first heavily doped region, a lightly doped region formed adjacent to the first heavily doped region, and a second heavily doped region formed apart from the first lightly doped region. The first heavily doped region and the lightly doped region act as a drain region of the MOSFET, and the second heavily doped region acts as a source region thereof.

A gate electrode, which is composed of a plurality of parts or layers, is positioned over a channel region. At least one of the parts has a drain-side end positioned over the lightly doped region and a source-side end positioned over the channel region not to extend to the second heavily doped region.

The parts or layers of the gate electrode may be made of a conductor and/or a semiconductor, respectively.

With the MOS semiconductor device according to the first aspect of the present invention, the asymmetric LDD structure of the MOSFET can be selectively provided by the presence or absence of the first part of the gate electrode. As a result, the device can be freely designed without the layout restriction described above in the conventional ones.

Preferably, the gate electrode is composed of a first part and a second part. The first part has a drain-side end positioned over the lightly doped region and a source-side end positioned over the channel region not to extend to the second heavily doped region.

The first part is preferably made of a patterned polysilicon film. The second part is preferably made of one of (a) a patterned polysilicon film, (b) a patterned refractory-metal silicide film, and (c) a combination of a patterned polysilicon film and a patterned refractory-metal silicide film.

The device may contain a plurality of the MOSFETs having the asymmetric LDD structure. In this case, it is preferable that the first heavily doped region is commonly used for the corresponding two ones of the MOSFETs.

The device may comprise another MOSFET having a symmetric LDD structure. In this case, it is preferable that the first heavily doped region is commonly used for the MOSFET having the symmetric LDD structure.

A fabrication method of an MOS semiconductor device according to a second aspect of the present invention contains the following steps:

After a gate insulator film is formed on a semiconductor substrate of a first conductivity, a first conducting film is formed on the gate insulator film to be patterned. A second conducting film is formed on the gate insulator film to cover the patterned first conducting film. A patterned resist film is formed on the second conducting film. The resist film has a first window that is positioned over the patterned first conducting film and a second window that is not positioned over the patterned first conducting film. Using the resist film as a mask, the second conducting film is patterned to form an upper part of a gate electrode of the MOSFET.

An impurity of a second conductivity type is ion-implanted into a surface area of the substrate using either the resist film or the patterned second conducting film as a mask, producing a lightly doped region under the first window and a first heavily doped region under the second window.

A channel region is formed in the surface area of the substrate between opposing ends of the lightly doped region and the first heavily doped region.

The first patterned conducting film is patterned again using either the resist film or the patterned second conducting film as a mask, producing a lower part of the gate electrode.

After forming a pair of sidewall spacers at each side of the gate electrode, an impurity of the second conductivity type is selectively ion-implanted into the surface area of the substrate using the gate electrode and the pair of sidewall spacers as a mask. Thus, a second heavily doped region is formed to be overlapped with the lightly doped region, so that the lightly doped region remains adjacent to the second heavily doped region.

The second heavily doped region and the remaining lightly doped region act as a drain region of the MOSFET and the first heavily doped region acts as a source region thereof.

With the fabrication method according to the second aspect of the invention, the asymmetric LDD structure of the MOSFET can be selectively provided by the formation and/or patterning of the first conducting film. Also, the length of the gate electrode is defined by not only the lower part of the gate electrode but also the upper part thereof. As a result, the MOS semiconductor device can be fabricated without the layout restriction described above in the conventional ones.

Further, since the first conducting film can be made thin enough to cause no problem concerning a lithography process, the MOS semiconductor device can be fabricated with high reproducibility in large quantities.

Preferably, the lower part of the gate electrode has a is drain-side end positioned over the remaining lightly doped region and a source-side end positioned over the channel region not to extend to the first heavily doped region.

The second conductive film may be formed on the gate insulator film to cover the patterned first conductive film. In this case, the drain-side end of the patterned second conductive film is positioned right over the drain-side end of the patterned first conductive film.

When the device contains a plurality of the MOSFETs having the asymmetric LDD structure, it is preferable that the first heavily doped region is commonly used for the corresponding two ones of the MOSFETs.

The device may comprise another MOSFET having a symmetric LDD structure. In this case, it is preferable that the first heavily doped region is commonly used for the MOSFET having the symmetric LDD structure.

DETAILED DESCRIPTION OF THE PREFERRED EMBODIMENTS

Figure 1:
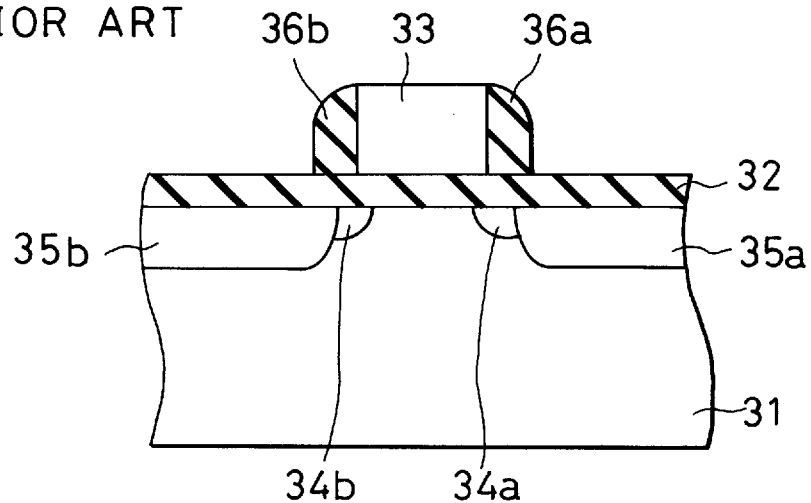
FIG. 1 is a schematic, cross-sectional view of a conventional MOS semiconductor device having a symmetric LDD structure.
Figure 2A:
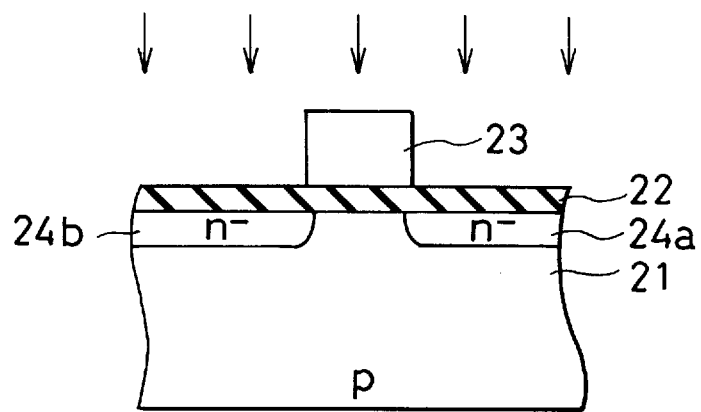
FIGS. 2A to 2C are schematic, cross-sectional views of another conventional MOS semiconductor device having an asymmetric LDD structure, which show a fabrication process sequence of the device, respectively.
Figure 2B:
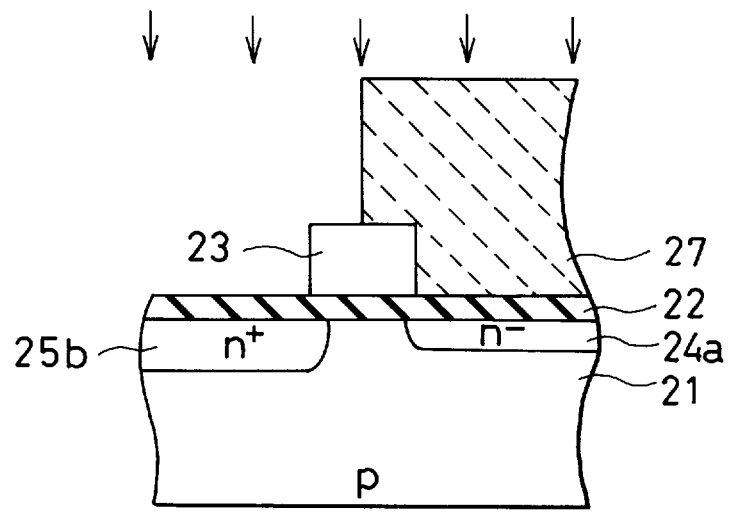
Figure 2C:
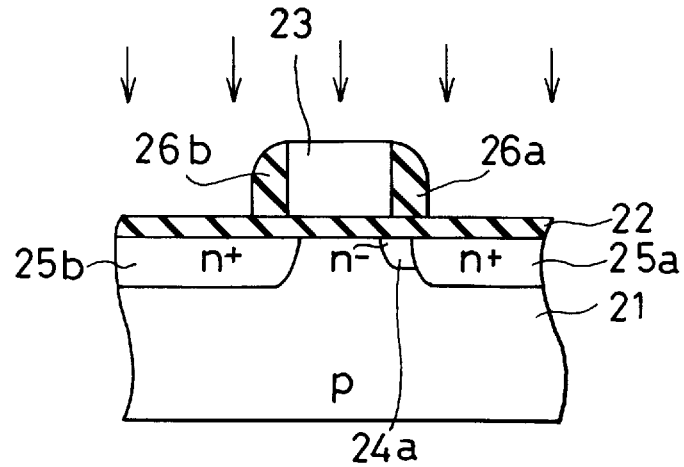

Preferred embodiments of the present invention will be described below while referring to the drawings attached.

Although each of MOS semiconductor devices according to the invention contains a large number of MOSFETs, only two of the MOSFETs are shown in this specification for the sake of simplification of description.

FIRST EMBODIMENT

An MOS semiconductor device according to a first embodiment is shown in FIG. 3F, which contains first and second n-channel MOSFETs M1 and M2.

As shown in FIG. 3F, an $n^+$-region $5a$ that is heavily doped with an n-impurity is formed in a surface area of a p-silicon substrate 1. The region $5a$ is commonly used for the MOSFETs M1 and M2. An $n^+$-region $5b$ for the MOSFET M1 and an $n^+$-region $5c$ for the MOSFET M2, both of which are heavily doped with an n-impurity, are formed in the surface area at each side of the region $5a$ at intervals.

An $n^-$-region $4a$ for the MOSFET M1 and an $n^-$-region $4b$ for the MOSFET M2, both of which are lightly doped with an n-impurity, are formed in the surface area at each side of the region $5a$. The $n^-$-regions $4a$ and $4b$ are adjacent to the $n^+$-region $5a$.

The $n^+$-region $5a$ and $n^-$-region $4a$ constitute a drain region of the MOSFET M1. The $n^+$-region $5b$ constitutes a source region of the MOSFET M1. A channel region for the MOSFET M1 is formed between the opposing ends of the $n^-$-region $4a$ and $n^+$-region $5b$.

The $n^+$-region $5a$ and $n^-$-region $4b$ constitute a drain region of the MOSFET M2. The $n^+$-region $5c$ constitutes a source region of the MOSFET M2. A channel region for the MOSFET M2 is formed between the opposing ends of the $n^-$-region $4b$ and $n^+$-region $5c$.

A gate oxide film 2 is formed on the surface area of the substrate 1 to cover the regions $5a$, $5b$, $5c$, $4a$ and $4b$. A gate electrode $3a$ is formed on the gate oxide film 2 right over the channel region for the MOSFET M1. The gate electrode 3a is composed of a lower part 3aa and an upper part 3ab.

The lower part 3aa is made of a patterned first conducting film. Here, the part 3aa is made of a patterned, doped polysilicon film. A source-side end of the part 3aa extends to nearly the center of the opposing ends of the n⁻-region 4a and the n⁺-region 5b. A drain-side end of the part 3aa is placed right over the n⁻-region 4a.

The upper part 3ab is made of a patterned second conducting film. Here, the part 3ab is made of a patterned, doped polysilicon film or a patterned refractory-metal silicide film. The upper part 3ab is formed on the lower part 3aa and the exposed gate oxide film 2. A drain-side end of the upper part 3ab is in accordance with the drain-side end of the lower part 3aa. A source-side end of the upper part 3ab extends to nearly the drain-side end of the n⁺-region 5b.

Similarly, a gate electrode 3b is formed on the gate oxide film 2 right over the channel region for the MOSFET M2.

The gate electrode 3b is composed of a lower part 3ba and an upper part 3bb.

The lower part 3ba is made of a patterned third conducting film. Here, the part 3ba is made of a patterned, doped polysilicon film. A source-side end of the lower part 3ba extends to nearly the center of the opposing ends of the n⁺-region 4b and the n⁺-region 5c. A drain-side end of the upper part 3ba is placed right over the n⁻-region 4b.

The upper part 3bb is made of a patterned fourth conducting film. Here, the part 3bb is made of a patterned, doped polysilicon film or a patterned refractory-metal silicide film. The upper part 3bb is formed on the lower part 3ba and the exposed gate oxide film 2. A drain-side end of the upper part 3bb is in accordance with the drain-side end of the lower part 3ba. A source-side end of the upper part 3bb extends to nearly the drain-side end of the n⁺+-region 5c.

A pair of sidewall spacers 6a and 6b for the MOSFET M1 are formed on the gate oxide film 2 adjacent to each side of the gate electrode 3a. The spacer 6a on the drain side is placed over the n⁺-region 5a and the n³¹ -region 4a. The spacer 6b on the source side is placed over the n⁺-region 5b.

A pair of sidewall spacers 6c and 6d for the MOSFET M2 are formed on the gate oxide film 2 adjacent to each side of the gate electrode 3b. The spacer 6c on the drain side is placed over the n⁺-region 5a and the n⁻-region 4b. The spacer 6d on the source side is placed over the n⁺-region 5c.

As described above, the MOSFET M1 is composed of the n⁺-region 5b as the source region, the combination of the n⁺-region 5a and n⁻-region 4a as the drain region, and the gate electrode 3a formed on the gate oxide film 2, which has an asymmetric LDD structure. Similarly, the MOSFET M2 is composed of the n⁺-region 5c as the source region, the combination of the n⁺-region 5a and n⁻-region 4b as the drain region, and the gate electrode 3b formed on the gate oxide film 2, which has an asymmetric LDD structure.

With the MOS semiconductor device of the first embodiment, the asymmetric LDD structures of the MOSFETs M1 and M2 can be selectively provided by the presence or absence of the lower parts 3aa and 3ba of the gate electrodes 3a and 3b, respectively. As a result, the device can be freely designed without the layout restriction described above in the conventional ones.

The MOS semiconductor device of the first embodiment is fabricated by the following process sequence.

First, the p-silicon substrate 1 is prepared, the doping concentration of which is selected to a desired value in order to adjust the threshold voltage of the MOSFETs M1 and M2.

Figure 3A:
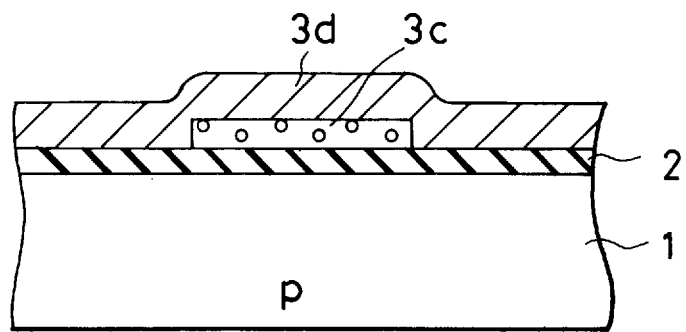
FIGS. 3A to 3E are schematic, cross-sectional views of an MOS semiconductor device according to a first embodiment of the invention, which show a fabrication process sequence of the device, respectively.

The gate oxide film 2 is then formed on the substrate 1 by a thermal oxidation process or the like, as shown in FIG. 3A.

The first conducting film 3c is formed on the gate oxide film 2 to be patterned to the specified rectangular plan shape. For example, as the film 3c, an n-polysilicon film that is heavily doped with an n-impurity such as phosphorus by a Low-Pressure Chemical Vapor Deposition (LPCVD) process or the like. This n-polysilicon film may be formed by two processes of (a) forming undoped polysilicon film and (b) diffusing an n-impurity such as phosphorus into the undoped polysilicon film in vapor phase.

The first conducting film 3c is 50 to 80 nm in thickness, which is less than the that of the popular polysilicon gate electrode. The thickness of the film 3c is equivalent to about (½.5) to (⅛) of that of the popular polysilicon gate electrode.

Next, the second conducting film 3d is formed on the entire substrate 1 to cover the patterned first conducting film 3c. As the second conducting film 3d, an n-or p-polysilicon film that is heavily doped with an n-or p-impurity or a refractory-metal silicide film may be used. The state at this stage is shown in FIG. 3A. The total thickness of the film 3d is typically about 100 to 400 nm.

Figure 3B:
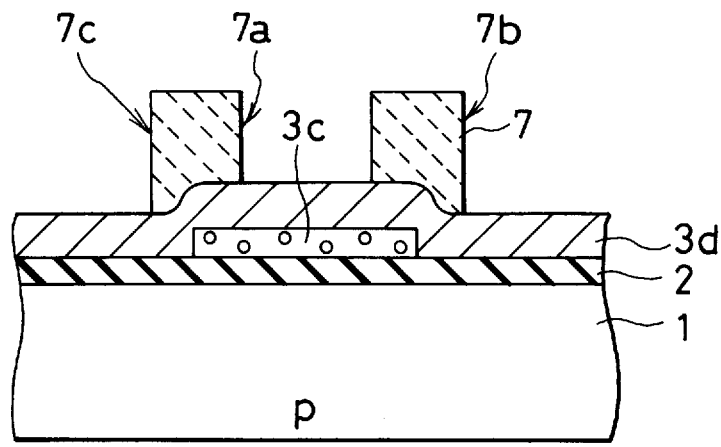

To form the gate electrodes 3a and 3b, a patterned photoresist film 7 is then formed on the second conducting film 3d. The resist film 7 has a first window 7a that is positioned over the patterned first conducting film 3c and second windows 7b and 7c that are not positioned over the first conducting film 3c. The remaining resist film 7 is positioned right over the both ends of the first conducting film 3c, as shown in FIG. 3B.

Figure 3C:
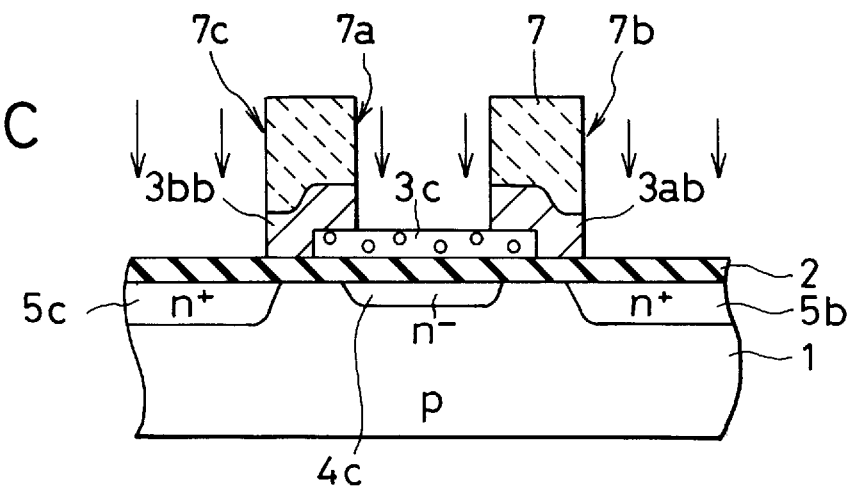

Using the patterned resist film 7 as a mask, the second conducting film 3d is selectively etched to form the upper part 3ab of the gate electrode 3a and the upper part 3bb of the gate electrode 3b, as shown in FIG. 3C. Although the film 3d has a step or height difference due to the underlying first conducting film 3c, no problem occurs relating to the patterning process because the height difference is about 50 to 80 nm.

When the second conducting film 3b is made of polysilicon, a satisfactory etching selectivity is difficult to be obtained because the first conducting film 3a also is made of polysilicon. However, such the satisfactory etching selectivity can be realized by (a) differentiating the doping concentration of the first conducting film 3a from that of the second conducting film 3b or by (b) making the film 3a small and employing a suitable end-point detector.

Subsequently, an n-impurity such as arsenic is ion-implanted into the surface area of the substrate 1 using the photoresist film 7, producing a lightly doped region 4c under the first window 7a and heavily doped regions 5b and 5c under the second windows 7b and 7c, as shown in FIG. 3C. The impurity ions are implanted into the substrate 1 through both the gate oxide film 2 and the first conducting film 3c in the first window 7a. The impurity ions are implanted into the substrate 1 through only the gate oxide film 2 in the second windows 7b and 7c.

The n-impurity ions are implanted at an acceleration energy of 70 keV with a dose of about $1 \times 10^{15}$ atoms/cm². The heavily doped regions 5b and 5c hear the peak doping concentration of $2 \times 10^{20}$ to $3 \times 10^{20}$ atoms/cm³. The lightly doped region 4c has the peak doping concentration of $1 \times 10^{18}$ atoms/cm³.

Figure 3D:
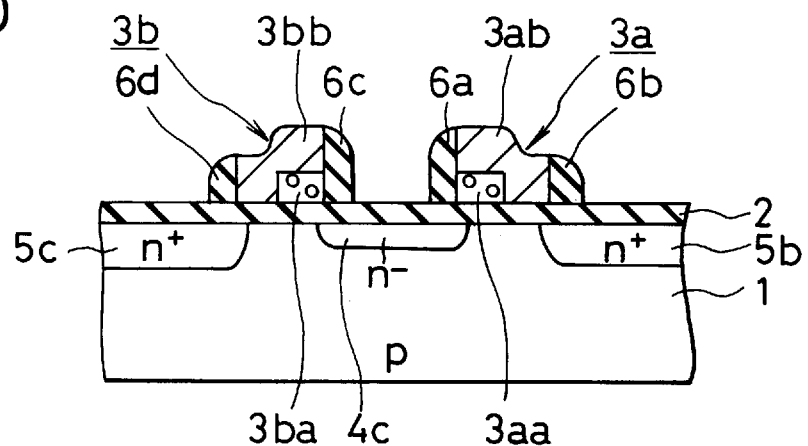

Using the photoresist film 7 as a mask, the first conducting film 3c is selectively etched to remove the part in the window 7a, producing the lower parts 3ab and 3bb on the gate oxide film 2, as shown in FIG. 3D. The lower part 3aa and the upper part 3ab constitute the gate electrode 3a of the MOSFET M1. The lower part 3ba and the upper part 3bb constitute the gate electrode 3b of the MOSFET M2.

After removing the photoresist film 7, a sidewall insulator film such as a silicon dioxide film is formed on the entire substrate 1 to cover the gate electrodes 3a and 3b by a CVD process or the like. The sidewall insulator film has a thickness of 100 to 150 nm. The sidewall insulator film is then anisotropically etched to produce the pair of sidewall spacers 6a and 6b at each side of the gate electrode 3a and the pair of sidewall spacers 6c and 6d at each side of the gate electrode 3b using a $CF_4$-system gas.

Figure 3E:
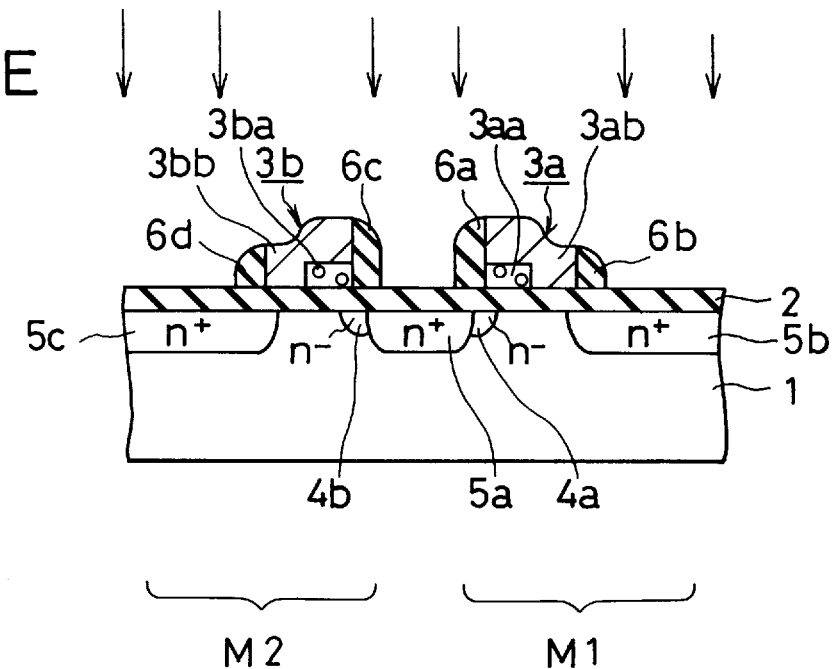

An n-impurity such as arsenic is ion-implanted into the surface area of the substrate 1 through the gate oxide film 2 using the gate electrodes 3a and 3b and the sidewall spacers 6a, 6b, 6c and 6d, producing the heavily doped region 5a to be overlapped with the lightly doped region 4c and the heavily doped regions 5b and 5c, as shown in FIG. 3E. Thus, the lightly doped region 4c remains adjacent to the heavily doped region 5a, forming the lightly doped regions 4a and 4b.

The heavily doped region 5a is nearly equal in depth to the heavily doped regions 5b and 5c. The region 5a is greater in depth than the lightly doped regions 4a and 4b. The n-impurity ions are implanted at an acceleration energy of 70 keV with a dose of about $1 \times 10^{15}$ atoms/$cm^2$.

The heavily doped regions 5b and 5c are doped with the impurity twice and therefore, the peak doping concentration increases to $4 \times 10^{20}$ to $6 \times 10^{20}$ atoms/$cm^3$. The heavily doped region 5a has the peak doping concentration of $2 \times 10^{20}$ to $4 \times 10^{20}$ atoms/$cm^3$. The lightly doped regions 4a and 4b have the peak doping concentration of $1 \times 10^{18}$ atoms/$cm^3$.

Thus, the MOS semiconductor device according to the first embodiment is obtained. A channel region for the MOSFET M1 is formed in the surface area of the substrate 1 between opposing ends of the lightly doped region 4a and the heavily doped region 5a. A channel region for the MOSFET M2 is formed in the surface area of the substrate 1 between opposing ends of the lightly doped region 4b and the heavily doped region 5a.

In the above fabrication method, during the first ion-implantation process (FIG. 3C) may be performed by using the upper parts 3ab and 3bb as a mask after removing the photoresist film 7. Also, the patterning process of the first conducting film 3c may be performed by using the upper parts 3ab and 3bb as a mask after removing the photoresist film 7.

With the fabrication method of the MOS semiconductor device of the first embodiment, the asymmetric LDD structures of the MOSFETs M1 and M2 can be selectively provided by the formation and/or patterning of the first conducting film 3c. Also, the lengths of the gate electrodes 3a and 3b are defined by not only the lower parts 3ab and 3bb but also the upper parts 3ba and 3bb. As a result, the MOS semiconductor device can be fabricated without the layout restriction described above in the conventional ones.

Further, since the first conducting film 3c can be made thin enough to cause no problem concerning a lithography process, the MOS semiconductor device can be fabricated with high reproducibility in large quantities.

SECOND EMBODIMENT

Figure 4:
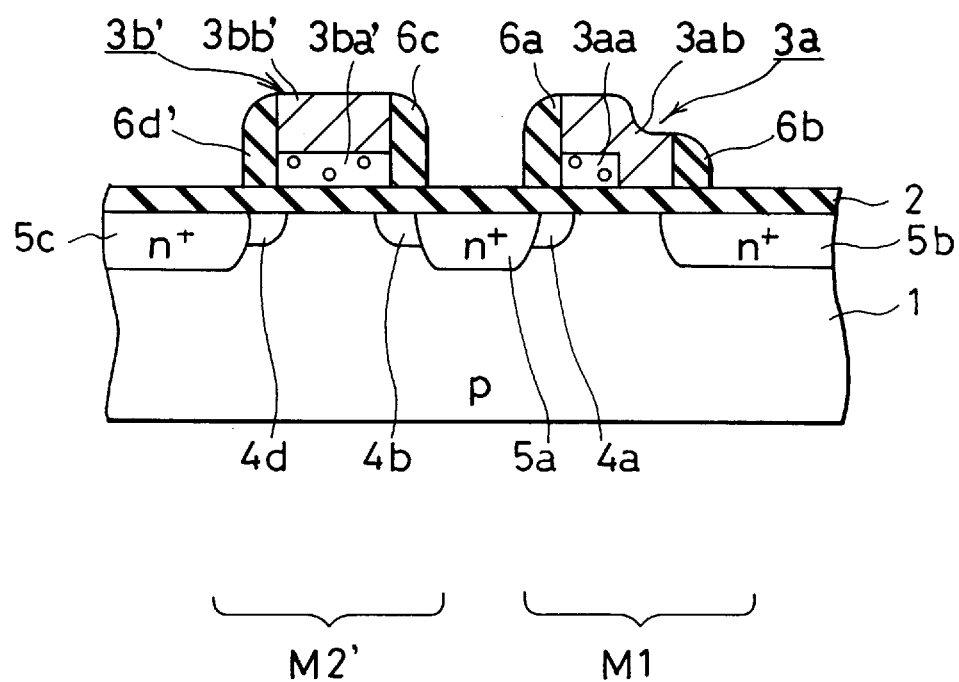
FIG. 4 is a schematic, cross-sectional view of an MOS semiconductor device according to a second embodiment of the invention.

FIG. 4 shows an MOS semiconductor device according to a second embodiment, which is the same in structure as that of the first embodiment except that an MOSFET M2' with a symmetric LDD structure is provided instead of the MOSFET M2 with the asymmetric LDD structure.

In the MOSFET M2', a gate electrode 3b'is composed of a lower part 3ba'and an upper part 3bb', both of which are extending over the entire channel region. A lightly doped region 4d is additionally formed adjacent to the heavily doped region 5c.

The device of the second embodiment is useful for a circuit that requires no polarity such as a transfer gate.

THIRD EMBODIMENT

Figure 5:
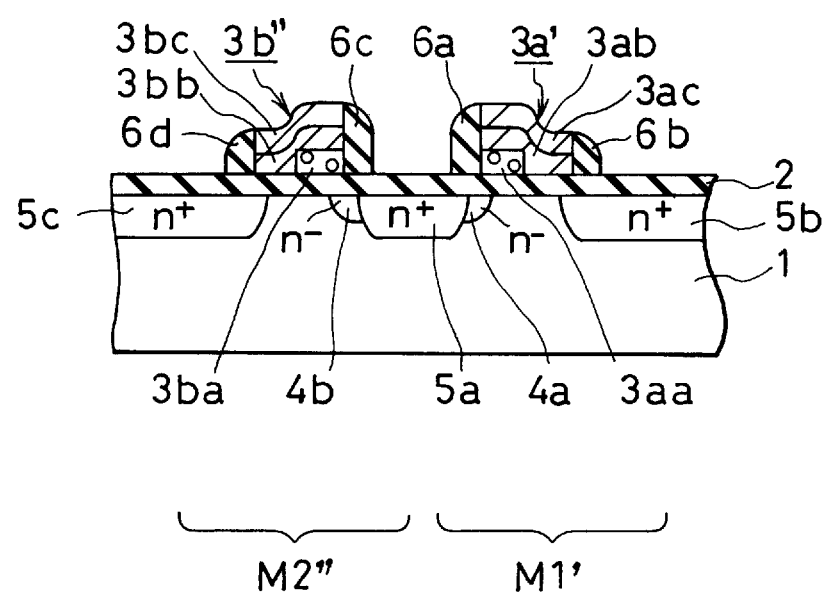
Fig. 5 is a schematic, cross-sectional view of an MOS semiconductor device according to a third embodiment of the invention.

FIG. 5 shows an MOS semiconductor device according to a third embodiment, which is the same in structure as that of the first embodiment except that MOSFETs M1' and M2" with an asymmetric LDD structure have three-layer gate electrodes 3a'and 3b".

The gate electrode 3a'of the MOSFETs M1' is composed of a lower part 3aa, a middle part 3ab and an upper part 3ac. The gate electrode 3b"of the MOSFETs M2" is composed of a lower part 3ba, a middle part 3bb and an upper part 3bc.

Preferably, the lower parts 3aa and 3ba are made of polysilicon, the middle parts 3ab and 3bb are made of polysilicon, and the upper parts 3ac and 3bc are made of refractory metal silicide.

FOURTH EMBODIMENT

FIGS. 6A to 6E show another fabrication method of the MOS semiconductor device according to the first embodiment.

Figure 6A:
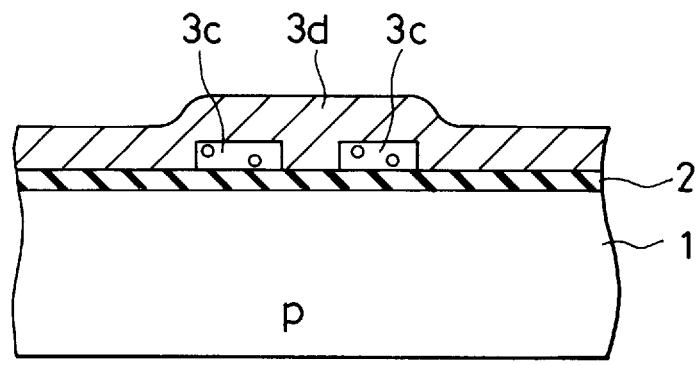
FIGS. 6A to 6E are schematic, cross-sectional views of the MOS semiconductor device according to the first embodiment of the invention, which show another fabrication process sequence of the device, respectively.
Figure 6B:
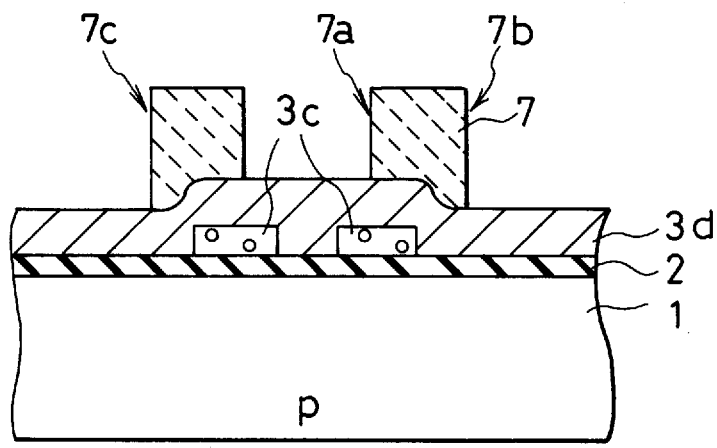

After the p silicon substrate 1 is prepared, the gate oxide film 2 is formed on the substrate 1 by a thermal oxidation process or the like, as shown in FIG. 6A. The first conducting film 3c is formed on the gate oxide film 2 to be patterned to the specified rectangular plan shape. The film 3C is divided into two parts placed at positions corresponding to lightly doped regions 4e and 4f, as shown in FIG. 6B.

Next, the second conducting film 3d is formed on the entire substrate 1 to cover the patterned first conducting film 3c. The state at this stage is shown in FIG. 6A.

To form the gate electrodes 3a and 3b, a patterned photoresist film 7 is then formed on the second conducting film 3d. The resist film 7 has a first window 7a that is positioned over the patterned first conducting film 3c and second windows 7b and 7c that are not positioned over the first conducting film 3c. The remaining resist film 7 is positioned right over the respective parts of the first conducting film 3c, as shown in FIG. 6B.

Figure 6C:
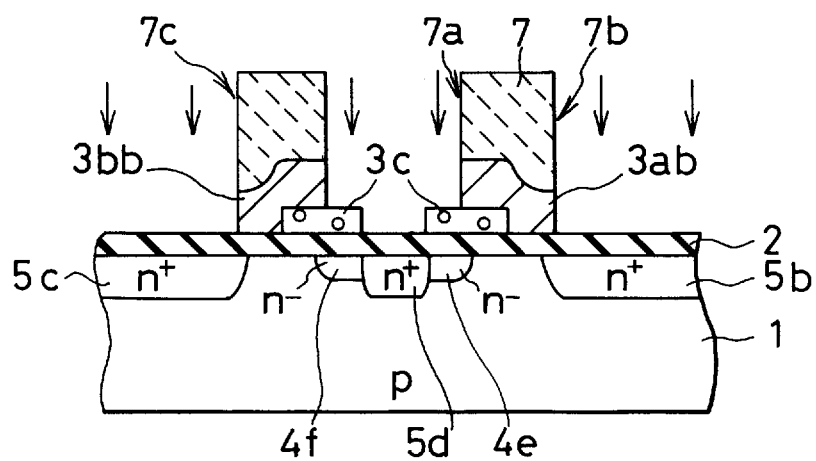

Using the patterned resist film 7 as a mask, the second conducting film 3d is selectively etched to form the upper part 3ab of the gate electrode 3a and the upper part 3bb of the gate electrode 3b, as shown in FIG. 6C.

Subsequently, an n-impurity such as arsenic is ion-implanted into the surface area of the substrate 1 using the photoresist film 7 as a mask. Thus, lightly doped regions 4e and 4f and a heavily doped region 5d are produced under the first window 7a. At the same time, heavily doped regions 5b and 5c are produced under the second windows 7b and 7c, as shown in FIG. 6C.

The impurity ions are implanted into the substrate 1 through both the gate oxide film 2 and the first conducting film 3c, resulting in the lightly doped regions 4e and 4f. On the other hand, the impurity ions are implanted into the substrate 1 through only the gate oxide film 2, resulting in the heavily doped regions 5b, 5c and 5d.

The n-impurity ions are implanted at an acceleration energy of 70 keV with a dose of about $1\times10^{15}$ atoms/cm$^2$. The heavily doped regions 5b and 5c have the peak doping concentration of $2\times10^{20}$ to $3\times10^{20}$ atoms/cm$^3$. The lightly doped region 4c has the peak doping concentration of $1\times10^{18}$ atoms/cm$^3$.

Figure 6D:
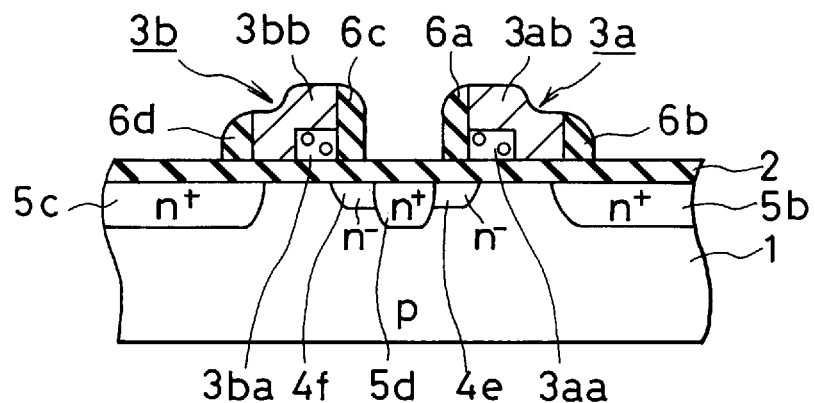

Using the photoresist film 7 as a mask, the first conducting film 3c is selectively etched to remove the part in the window 7a, producing the lower parts 3ab and 3bb on the gate oxide film 2, as shown in FIG. 6D. After removing the photoresist film 7, the pair of sidewall spacers 6a and 6b are formed at each side of the gate electrode 3a and the pair of sidewall spacers 6c and 6d at each side of the gate electrode 3b.

Figure 6E:
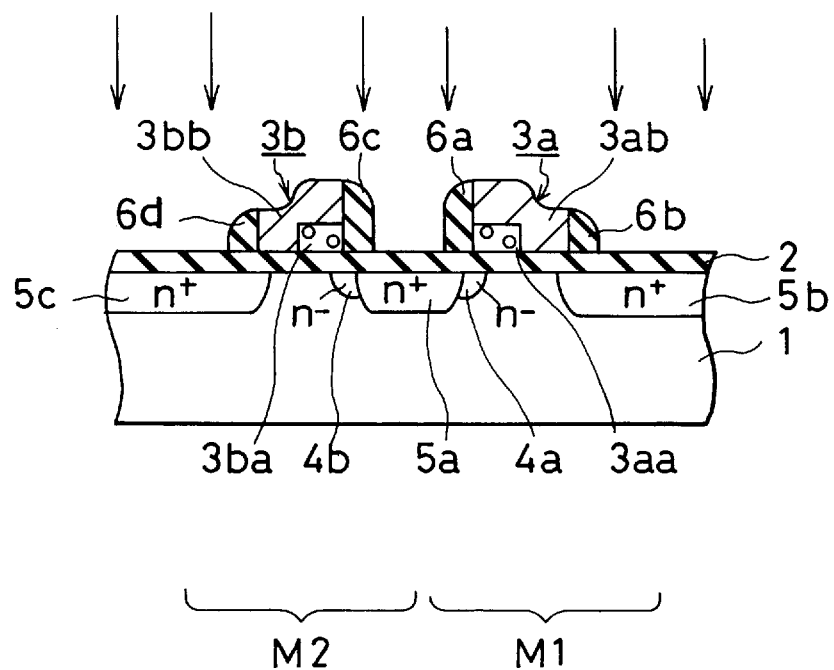

An n-impurity such as arsenic is ion-implanted into the surface area of the substrate 1 through the gate oxide film 2 using the gate electrodes 3a and 3b and the sidewall spacers 6a, 6b, 6c and 6d as a mask, producing the heavily doped region 5a to be overlapped with the lightly doped regions 4e and 4f and the heavily doped region 5a, as shown in FIG. 6E. Thus, the lightly doped regions 4a and 4b are formed adjacent to the region 5a. The heavily doped regions 5b and 5c are doped with the impurity twice. The n-impurity ions are implanted at an acceleration energy of 70 keV with a dose of about $1\times10^{15}$ atoms/cm$^2$.

The peak doping concentration of the heavily doped regions 5b and 5c increases to $4\times10^{20}$ to $6\times10^{20}$ atoms/cm$^3$. The heavily doped region 5a has the peak doping concentration of $2\times10^{20}$ to $4\times10^{20}$ atoms/cm$^3$. The lightly doped regions 4a and 4b have the peak doping concentration of $1\times10^{18}$ atoms/cm$^3$.

Thus, the MOS semiconductor device according to the first embodiment is obtained.

Also in the above fabrication method, during the first ion-implantation process (FIG. 6C) may be performed by using the upper parts 3ab and 3bb as a mask after removing the photoresist film 7. Also, the patterning process of the first conducting film 3c may be performed by using the upper parts 3ab and 3bb as a mask after removing the photoresist film 7.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An MOS semiconductor device containing an MOSFET, said device comprising:

a semiconductor substrate of a first conductivity type;

a first heavily doped region of a second conductivity type opposite to said first conductivity type, said first heavily doped region being formed in a surface area of said substrate;

a lightly doped region of said second conductivity type formed in said surface area of said substrate, said lightly doped region being adjacent to said first heavily doped region; said first heavily doped region and said lightly doped region acting as a drain region of said MOSFET;

a second heavily doped region of said second conductivity type formed in said surface area of said substrate apart from said first heavily doped region and said lightly doped region;

said second heavily doped region acting as a source region of said MOSFET;

a channel region being formed between a source-side end of said lightly doped region and a drain-side end of said second heavily doped region;

said first heavily doped region, said second heavily doped region and said lightly doped region constituting an asymmetric LDD structure;

a gate insulator film formed on said surface area of said substrate to cover said first heavily doped region, said second heavily doped region and said lightly doped region;

a gate electrode formed on said gate insulator film to be positioned over said channel region, said gate electrode being composed of a plurality of parts;

a first part of said plurality of parts having a drain-side end positioned over said lightly doped region and a source-side end positioned over said channel region not to extend to said second heavily doped region; and a second part of said plurality of parts being formed on and in contact with said first part and said gate insulator film.

2. The device as claimed in claim 1, wherein a position of said lightly doped region is dependent upon a position of said first part of said plurality of parts of said gate electrode.

3. The device as claimed in claim 1, wherein said first part of said plurality of parts of said gate electrode is made of a patterned polysilicon film, and said second part of said plurality of parts is made of one of (a) a patterned polysilicon film, (b) a patterned refractory-metal silicide film, and (c) a combination of a patterned polysilicon film and a patterned refractory-metal silicide film.

4. The device as claimed in claim 1, wherein said drain-side end of said second part of said plurality of parts is positioned right over said drain-side end of said first part of said plurality of parts.

5. The device as claimed in claim 1, further comprising first and second sidewall spacers formed on said gate insulator film, said first sidewall spacer being placed on a drain side of said gate electrode and said second sidewall spacer being placed on a source side of said gate electrode;

and wherein said drain-side end of said second part of said plurality of parts is positioned right over said drain-side end of said first part of said plurality of parts.

6. The device as claimed in claim 1, further comprising another MOSFET having a symmetric LDD structure, wherein said first heavily doped region is commonly used for said MOSFET having said symmetric LDD structure.

7. An MOS semiconductor device containing first and second MOSFETs, said first and second MOSFET's each having an asymmetric LDD structure, said device comprising:

a semiconductor substrate of a first conductivity type;

a first heavily doped region of a second conductivity type opposite to said first conductivity type, said first heavily doped region being formed in a surface area of said substrate;

first and second lightly doped regions of said second conductivity type formed in said surface area of said substrate, said first lightly doped region being adjacent to one side of said first heavily doped region and said second lightly doped region being adjacent to another side thereof;

said first heavily doped region and said first lightly doped region acting as a drain region of said first MOSFET, and said first heavily doped region and said second lightly doped region acting as a drain region of said second MOSFET;

a second heavily doped region of said second conductivity type formed in said surface area of said substrate apart from said first heavily doped region and said lightly doped region;

said second heavily doped region acting as a source region of said first MOSFET;

a third heavily doped region of said second conductivity type formed in said surface area of said substrate, said third heavily doped region acting as a source region of said second-MOSFET;

a first channel region for said first MOSFET being formed between a source-side end of said first lightly doped region and a drain-side end of said second heavily doped region;

a second channel region for said second MOSFET being formed between a source-side end of said second lightly doped region and a drain-side end of said third heavily doped region;

said first heavily doped region, said second heavily doped region and said first lightly doped region constituting an asymmetric LDD structure for said first MOSFET, and said first heavily doped region, said third heavily doped region and said second lightly doped region constituting an asymmetric LDD structure for said second MOSFET;

a gate insulator film formed on said surface area of said substrate to cover said first heavily doped region, said second heavily doped region, said first lightly doped region and said second lightly doped region;

a first gate electrode formed on said gate insulator film to be positioned over said first channel region, said first gate electrode being composed of a plurality of parts, a first part of said plurality of parts having a drain-side end positioned over said first lightly doped region and a source-side end positioned over said first channel region not to extend to said second heavily doped region, a second part of said plurality of parts being formed on and in contact with said first part and said gate insulator film;

and a second gate electrode formed on said gate insulator film to be positioned over said second channel region, said second gate electrode being composed of a plurality of parts, a first part of said plurality of parts having a drain-side end positioned over said second lightly doped region and a source-side end positioned over said second channel region not to extend to said third heavily doped region, a second part of said plurality of parts being formed on and in contact with said first part and said gate insulator film.

8. The device as claimed in claim 7, wherein a position of said first lightly doped region is dependent upon a position of said first part of said plurality of parts of said first gate electrode, and a position of said second lightly doped region is dependent upon a position of said first part of said plurality of parts of said second gate electrode.

9. The device as claimed in claim 7, wherein said first part of said plurality of parts of said first gate electrode is made of a patterned polysilicon film, and said second part of said plurality of parts is made of one of (a) a patterned polysilicon film, (b) a patterned refractory-metal silicide film, and (c) a combination of a patterned polysilicon film and a patterned refractory-metal silicide film;

and wherein said first part of said plurality of parts of said second gate electrode is made of a patterned polysilicon film, and said second part of said plurality of parts is made of one of (a) a patterned polysilicon film, (b) a patterned refractory-metal silicide film, and (c) a combination of a patterned polysilicon film and a patterned refractory-metal silicide film.

10. The device as claimed in claim 7, wherein a drain-side end of said second part of said plurality of parts of said first gate electrode is positioned right over said drain-side end of said first part of said plurality of parts of said first gate electrode;

and wherein a drain-side end of said first part of said plurality of parts of said second gate electrode is positioned right over said drain-side end of said first part of said plurality of parts of said second gate electrode.

11. The device as claimed in claim 7, further comprising first, second, third and fourth sidewall spacers formed on said gate insulator film;

wherein said first sidewall spacer is placed on a drain side of said first gate electrode, said second sidewall spacer is placed on a source side of said first gate electrode, said third sidewall spacer is placed on a drain side of said second gate electrode, and said fourth sidewall spacer is placed on a source side of said second gate electrode;

and wherein a drain-side end of said second part of said plurality of parts of said first gate electrode is positioned right over said drain-side end of said first part of said plurality of parts of said first gate electrode;

and wherein a drain-side end of said second part of said plurality of parts of said second gate electrode is positioned right over said drain-side end of said first part of said plurality of parts of said second gate electrode.

* * * * *

UNITED STATES PATENT AND TRADEMARK OFFICE
CERTIFICATE OF CORRECTION

PATENT NO. : 5,828,104
DATED: October 27, 1998
INVENTOR(S): Kazuyuki MIZUSHIMA

It is certified that error(s) appears in the above-identified patent and that said Letters Patent is hereby corrected as shown below:

Column 2, line 50, delete "drain can be prevented" and insert --drain side, the above problem can be prevented--.

Column 2, line 61, delete "wore" and insert --were--.

Column 3, line 52, delete "200 to 400 µm" and insert --200 to 400 nm--.

Column 5, line 52, delete "is".

Column 7, line 26, delete "$n^+$-region 4b" and insert --$n^-$-region 4b--.

Column 7, line 39, delete "$n^{3^1}$-region" and insert --$n^-$-region--.

Column 8, line 15, delete "(½.5)" and insert --(1/2.5)--.

Column 8, line 60, delete "hear" and insert --have--.

Signed and Sealed this

First Day of June, 1999

Attest:

Attesting Officer

Q. TODD DICKINSON

Acting Commissioner of Patents and Trademarks